United States Patent [19]

Lentine

[11] Patent Number: 4,800,262

[45] Date of Patent: Jan. 24, 1989

[54] TRI-STATE OPTICAL DEVICE WITH QUANTUM WELL ABSORPTION

[75] Inventor: Anthony L. Lentine, St. Charles, Ill.

[73] Assignee: American Telephone and Telegraph Company, AT&T Bell Laboratories, Murray Hill, N.J.

[21] Appl. No.: 140,198

[22] Filed: Dec. 31, 1987

[51] Int. Cl.[4] .................. H01J 40/14; H01L 27/12
[52] U.S. Cl. .................................. 250/211 J; 357/4; 250/213 A
[58] Field of Search ............... 250/211 J, 211 R, 578, 250/213 A; 365/109, 110, 112; 377/102; 357/30 R, 24 LR, 4, 16

[56] References Cited

U.S. PATENT DOCUMENTS

| | | | |
|---|---|---|---|
| 3,753,247 | 8/1973 | Rajchman | 365/112 |
| 4,166,224 | 8/1979 | Hutson | 357/30 |
| 4,506,151 | 3/1985 | MacDonald et al. | 250/213 A |
| 4,525,687 | 6/1985 | Chemla et al. | 350/355 |
| 4,546,244 | 10/1985 | Miller | 250/211 |
| 4,691,111 | 9/1987 | Bovino | 250/211 J |
| 4,716,449 | 12/1987 | Miller | 357/4 |
| 4,720,175 | 1/1988 | Haus et al. | 350/354 |
| 4,749,850 | 6/1988 | Chemla et al. | 250/211 J |
| 4,751,378 | 6/1988 | Hinton et al. | 250/211 J |
| 4,754,132 | 6/1988 | Hinton et al. | 250/211 J |

OTHER PUBLICATIONS

D. A. B. Miller et al., "The Quantum Well Self-Electrooptic Effect Device: Optoelectronic Bistability and Oscillation, and Self-Linearized Modulation:", *IEEE Journal of Quantum Electronics*, vol. OE-21, No. 9, Sep. 1985, pp. 1462-1476.

D. A. B. Miller et al., "Integrated Quantum Well Self-Electro-Optic Effect Device: 2×2 Array of Optically Bistable Switches", *Applied Physics Letters*, vol. 49, No. 13, Sep. 1986, pp. 821-823.

*Primary Examiner*—David C. Nelms
*Assistant Examiner*—Michael Messinger
*Attorney, Agent, or Firm*—Ross T. Watland

[57] ABSTRACT

A tri-state optical device 400 is disclosed having photodiodes 401 and 402 with respective quantum-wells 403 and 404 in the intrinsic regions. The photodiodes are connected in series with a bipolar switch 406 and a source of electrical potential 405 for emitting a pair of optical output beams having various combinations of power levels depending on the state of the bipolar switch and the ratio of two optical control beams incident on the photodiodes. In one state of the tri-state device with the bipolar switch in a conducting state, the two output beams have complementary high and low power levels representing, for example, high and low logic levels "1" and "0". In a second state, the power levels of the two output beams are reversed, thus exhibiting complementary and symmetric output power levels. In the third state when the bipolar switch of the tri-state device in a nonconducting state, the output beams both exhibit a low power level, and the tri-state device is nonresponsive to the power levels of the optical control beams.

16 Claims, 6 Drawing Sheets

TRI-STATE OPTICAL DEVICE WITH QUANTUM WELL ABSORPTION

CROSS-REFERENCE TO RELATED APPLICATION

This application is related to the application of T. J. Cloonan, H. S. Hinton, and F. B. McCormick, Jr. entitled "An Optical Switch" which application is assigned to the assignee of the present application, and is being filed concurrently herewith.

TECHNICAL FIELD

This invention relates to nonlinear optical devices and particularly to those devices employing high gain or feedback resulting in multistable optical states or other nonlinear optical responses.

BACKGROUND OF THE INVENTION

A bistable optical device has been previously described in U.S. patent application, Ser. No. 042,411, of H. S. Hinton, A. L. Lentine, and D. A. B. Miller, entitled "Symmetric Optical Device", that includes a pair of p-i-n photodiodes with quantum-wells in the intrinsic regions. This device operates as a bistable memory element with complementary and symmetric optical outputs, thereby functioning as an optical S-R latch with well-known set and reset states. The device exhibits time sequential gain in that the state of the device can be either set or reset with low power level beams and that the state of the device can be subsequently determined with high power level beams. Another feature of the device is that the switching point is determined by the ratio of the two input light beams, thus making the device insensitive to optical power supply variations when both of the two input beams are derived from the same source. The complementary output beams facilitate use in well-known "dual-rail" logic applications.

However, applications may arise where it is desirable to have a three-state optical device.

SUMMARY OF THE INVENTION

The foregoing problem is solved and a technical advance is achieved by an improvement to the symmetric optical device in an illustrative tri-state optical device having first and second p-i-n photodiodes with quantum-wells in the intrinsic regions, which are connected in series with a bipolar switch and a source of electrical potential. In one state, the two output light beams are complementary such that the first output beam has an intensity representing a logic level "1" with the intensity of the second beam representing a logic level "0". In a second state, the two output beams are also complementary, but they represent the opposite logic level from that of the first state. For instance, the first output beam represents a logic level "0", and the second output beam represents a logic level "1". In the third state, the output beams both represent the logic level "0".

In one illustrative embodiment where the bipolar switch is a transistor, when the ratio of the control current in the base of the transistor to the optical power of the light beams incident on each of the serially connected quantum-well p-i-n photodiodes is larger than a threshold amount, the transistor operates similar to a short circuit. Thus, the tri-state device operates as the previously described symmetric optical device with output light beams representing either one of two complementary and symmetric levels. However, when the ratio of the base control current to the power of the incident light beams on each of the photodiodes is less than a second threshold amount, then the transistor operates like an open circuit. In this case, all of the electrical supply voltage appears across the collector and emitter of the transistor. As a result, zero volts appears across each of the quantum-well p-i-n photodiodes, and the level of both optical output beams represents a low logic level "0". A significant advantage is that the tri-state optical device not only exhibits the desired three states, but is also photonically as well as electrically controllable. As a result, the tri-state device is extremely useful in optical systems where both photonic as well as electrical control is utilized.

Alternatively, a field-effect transistor is advantageously utilized in place of the bipolar transistor to be effectively turned on and off by a voltage stimulus on the gate instead of a current stimulus on the base of the bipolar transistor.

In a third embodiment, a photonically controlled switch element such as a p-i-n photodiode is advantageously substituted for the bipolar switch to photonically control the tri-state optical device in addition to the control light beams on the quantum-well photodiodes. This advantageously provides external photonic control of the tri-state device.

Advantageously, each of the three aforementioned embodiments can be fabricated into a monolithic integrated structure to form large arrays of these devices.

DETAILED DESCRIPTION

Figure 1:
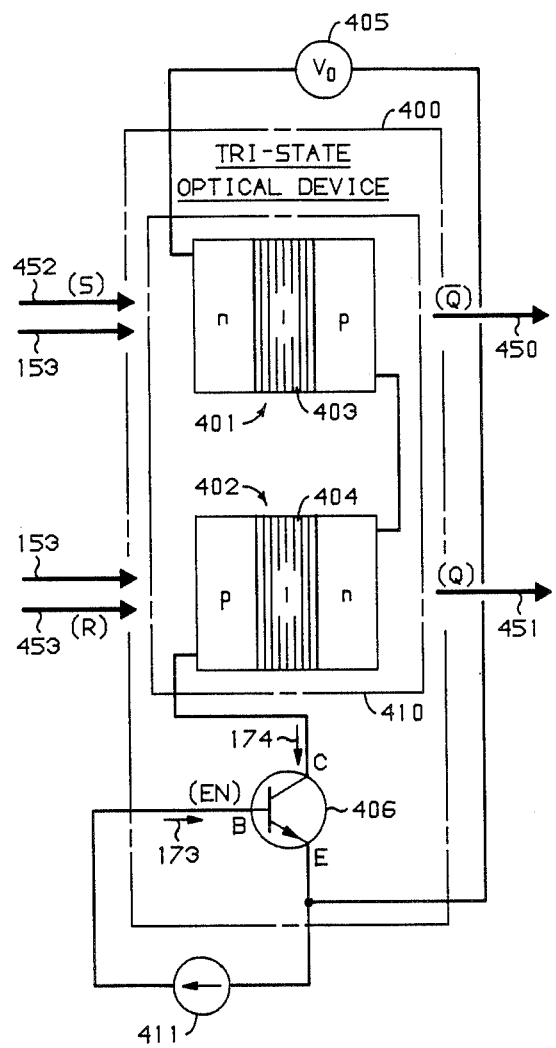
FIG. 1 depicts an illustrative tri-state optical device including a bistable optical device and a bipolar switch.

Depicted in FIG. 1 is an illustrative tri-state optical device 400 comprising a bistable optical device 410 and a bipolar switch, n-p-n transistor 406, which are serially connected to an electrical potential source 405. Bistable optical device 410 comprises serially connected p-i-n photodiodes 401 and 402 containing respective multiple quantum-well regions 403 and 404. Photocurrent 174 is the resultant current produced by optical signals 153 and 452 having a first combined optical power incident on p-i-n photodiode 401 and optical signals 153 and 453 having a second combined optical power incident on p-i-n photodiode 402. When the ratio of the base current 173 to each of the first and second combined optical powers is greater than a first predetermined amount, bipolar transistor 406 is in a well-known "saturated" state and exhibits a low voltage ($\approx 0.2$ v) across its collector to emitter. In this "saturated" state, the transistor operates as a short circuit, and optical device 410 operates as described in U.S. patent application, Ser. No. 042,411, of H. S. Hinton, A. L. Lentine, and D. A. B. Miller. Briefly, when transistor 406 is saturated, bistable optical device 410 as well a tri-state optical device 400 operates as an optical bistable S-R latch. When applied to photodiode 401, control light beam 452 sets the state of the device to a well-known "set" state. When applied to photodiode 402, control light beam 453 resets the state of the device to a well-known "reset" state. When clocked bias beam 153 is applied simultaneously to photodiodes 401 and 402, the device emits from photodiodes 401 and 402 a pair of complementary and symmetric output beams 450 and 451 representing the complementary state $\overline{Q}$ and the actual state Q of the device, respectively.

When the ratio of the base current 173 to each of the first and second combined optical powers is less than a second predetermined amount, the n-p-n transistor operates as an open circuit, and the collector-emitter voltage of the transistor approximately equals the power supply voltage 405. In this case, the voltage across each of p-i-n photodidoes 401 and 402 and hence each of quantum-well regions 403 and 404 equals approximately zero, and the optical absorption of each of the quantum-well regions is maximized. As a result, output light beams 450 and 451 are no longer complementary. Instead, each of the output light beams has an optical power level that represents a low logic level "0". As a consequence, optical device 400 is said to be a tri-state device. A p-n-p transistor with corresponding polarity changes may also be used instead of n-p-n transistor 406.

Figure 2:
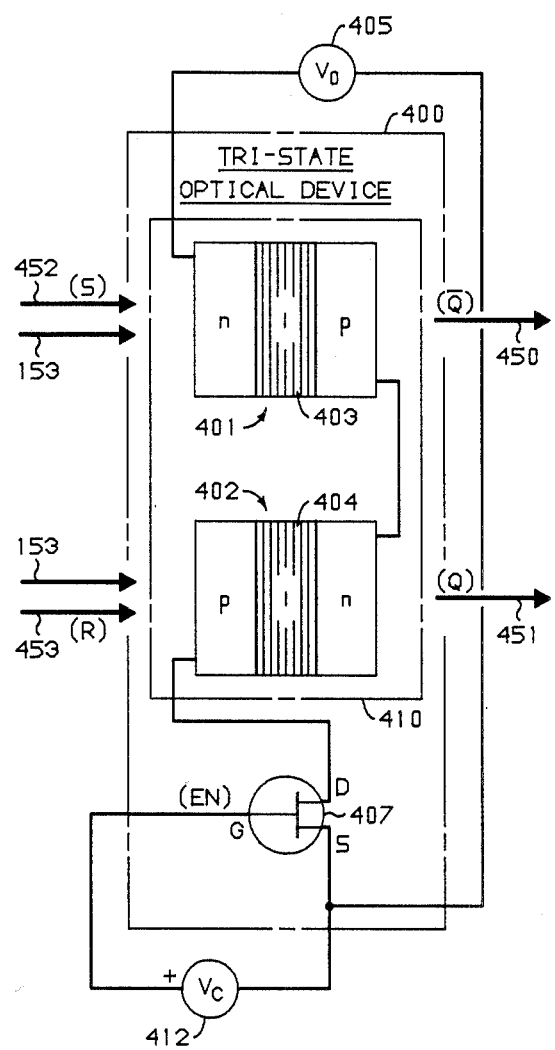
FIG. 2 depicts a second embodiment of the tri-state optical device of FIG. 1.

As depicted in FIG. 2, well-known field effect transistor 407 and electric potential source 412 are substituted for n-p-n transistor 406 and current source 411 of FIG. 1, respectively. When the gate-source voltage of FET 407 is sufficiently negative, the device operates as an open circuit and emits a pair of output light beams each having a low power level representing a logic level "0". When the gate-source voltage of FET 407 is sufficiently about a threshold voltage, FET 407 operates as a short circuit and emits complementary output light beams representing complementary low and high logic levels "0" and "1".

A truth table illustrating the states of the power levels of the output light beams is provided in Table A.

TABLE A

|  | In | | | Out | |
| --- | --- | --- | --- | --- | --- |
|  | S | R | En | Q | $\overline{Q}$ |
| Disabled | 0 | 1 | 0 | 0 | 0 |
|  | 1 | 0 | 0 | 0 | 0 |
| Enabled | 0 | 1 | 1 | 0 | 1 |
|  | 1 | 0 | 1 | 1 | 0 |

Figure 3:
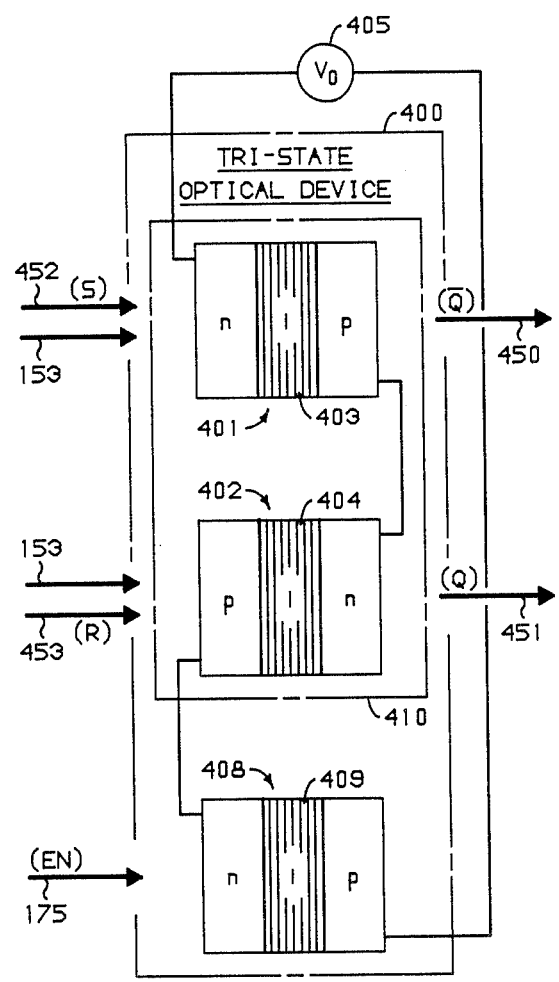
FIG. 3 depicts a third embodiment of the tri-state optical device of FIG. 1.

As depicted in FIG. 3, a third p-i-n photodiode 408 having a quantum-well region 409 replaces n-p-n bipolar transistor 406 as shown in FIG. 1. This photodiode may be identical to p-i-n photodiodes 401 and 402, or alternatively, it may not contain quantum-well region 409. In operation, when the power level of input control light beam 175 is substantially greater than the combined power levels of the optical input beams 153 and 452 incident on first p-i-n photodiode 401 and optical input beams 153 and 453 incident on second p-i-n photodiode 402, then p-i-n photodiode 407 will exhibit a voltage drop of approximately zero volts, and the device will operate as a short circuit. As a consequence, tri-state device 400 operates as an optical S-R latch as previously described. Alternately, when the power level of input control beam 175 is substantially less than each of the combined power levels of optical input signals 153 and 452 incident on first p-i-n photodiode 401 and the combined power levels of optical signals 153 and 453 incident on second p-i-n photodiode 402 then the voltage across p-i-n photodiode 408 will be approximately equal to the voltage of electrical potential source 405, and the voltage on photodiodes 401 and 402 will be approximately zero volts. Output light beams 450 and 451 will be both at a power level representing a low logic level "0" as was described with n-p-n transistor 406 operated as an open circuit.

Figure 6:
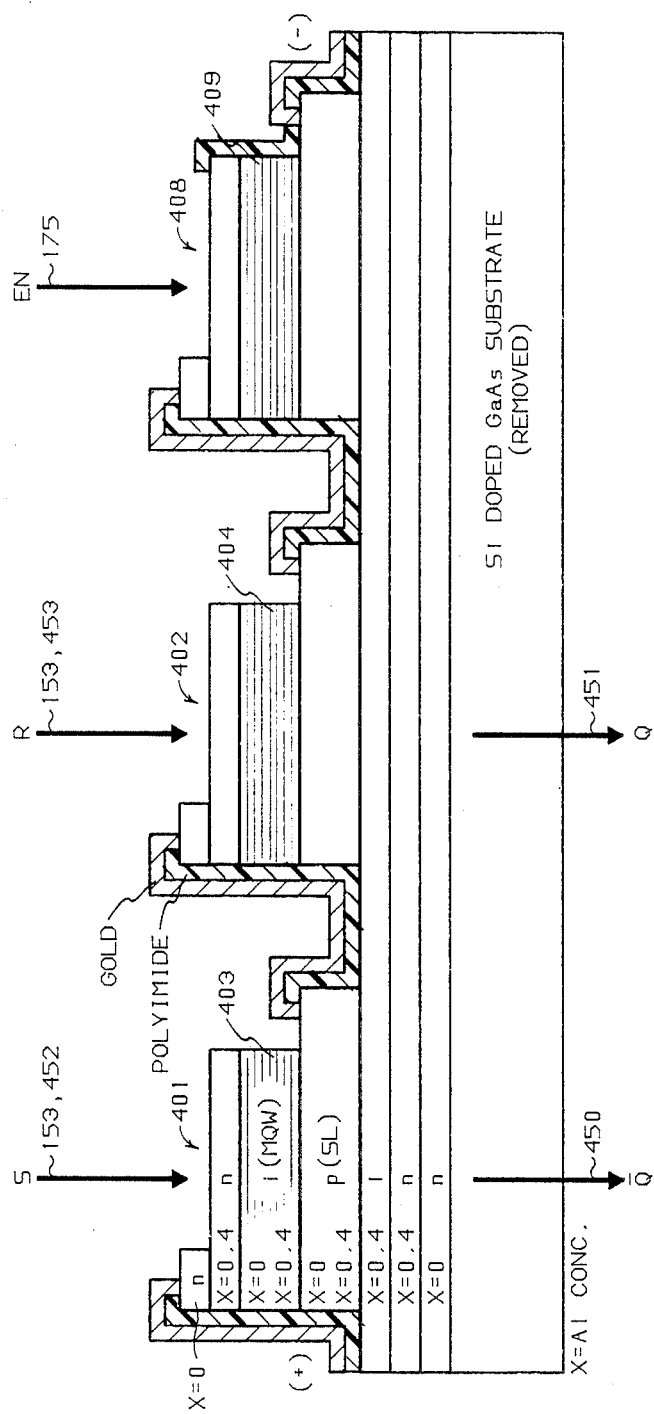
FIG. 6 depicts a monolithically integrated version of the tri-state optical device of FIG. 3.

An integrated device is made using the structure depicted in FIGS. 8 and 9 of U.S. patent application, Ser. No. 042,411, of H. S. Hinton, A. L. Lentine, and D. A. B. Miller, entitled "Symmetric Optical Device", with three mesas instead of the two mesas depicted in FIG. 7 of that application. A monolithically integrated version of the tri-state optical device of FIG. 3 is depicted in FIG. 6.

Figure 4:
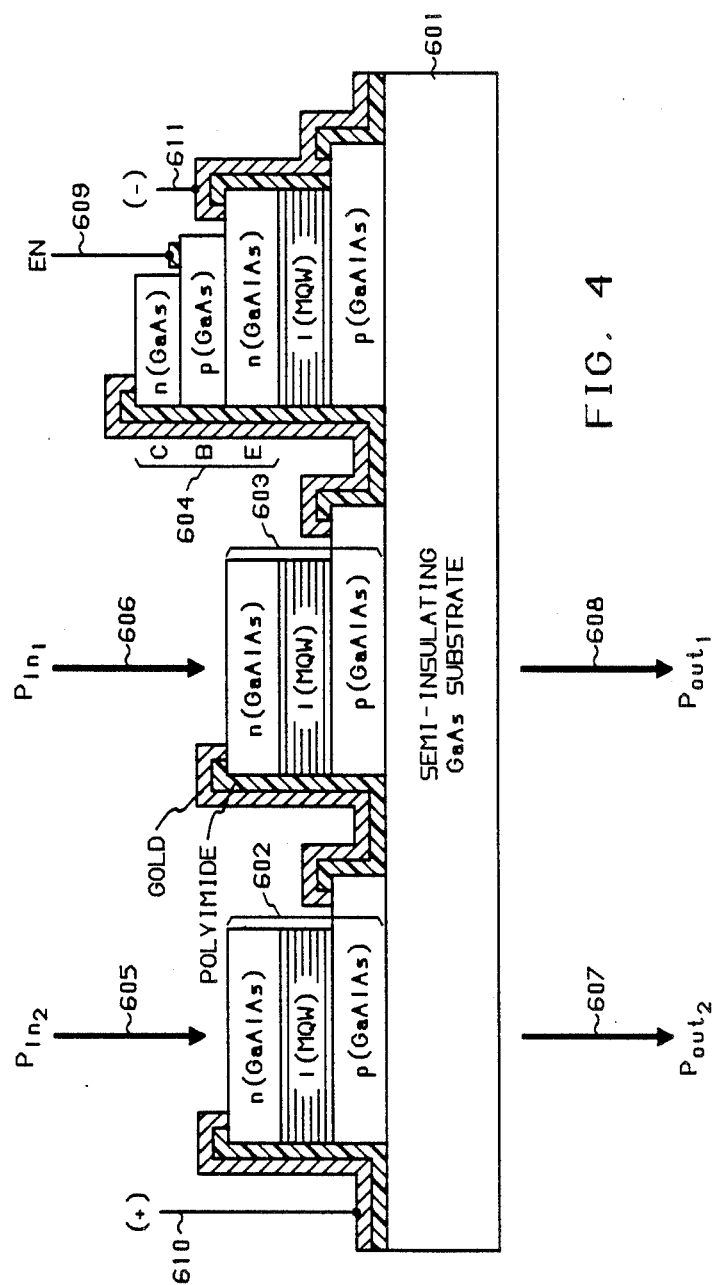
FIG. 4 depicts a monolithically integrated version of the tri-state optical device of FIG. 1.

Depicted in FIG. 4 is a monolithically integrated version of the device depicted in FIG. 1, which includes n-p-n heterojunction bipolar transistor 604 with two p-i-n photodiodes 602 and 603 with quantum-wells in each of the intrinsic regions. The general structure is described in U.S. patent application, Ser. No. 006,327, filed Jan. 14, 1987, of D. A. B. Miller, entitled "Nonlinear and Bistable Optical Device", which is a continuation of U.S. patent application, Ser. No. 785,546, filed Oct. 8, 1985, which is a continuation of U.S. Pat. No. 4,546,244. The material can be grown by molecular beam epitaxy and processed using standard semiconductor processing techniques. The substrate 601 is etched underneath p-i-n photodiodes 602 and 603 to allow light to pass. The optical input beams 605 and 606 are incident on top of the device; respective optical output beams 607 and 608 exit from the bottom of the device. The control lead 609 is attached using standard well-known techniques to the base of transistor 604. The power supply connections are made via power supply terminals 610 and 611.

Figure 5:
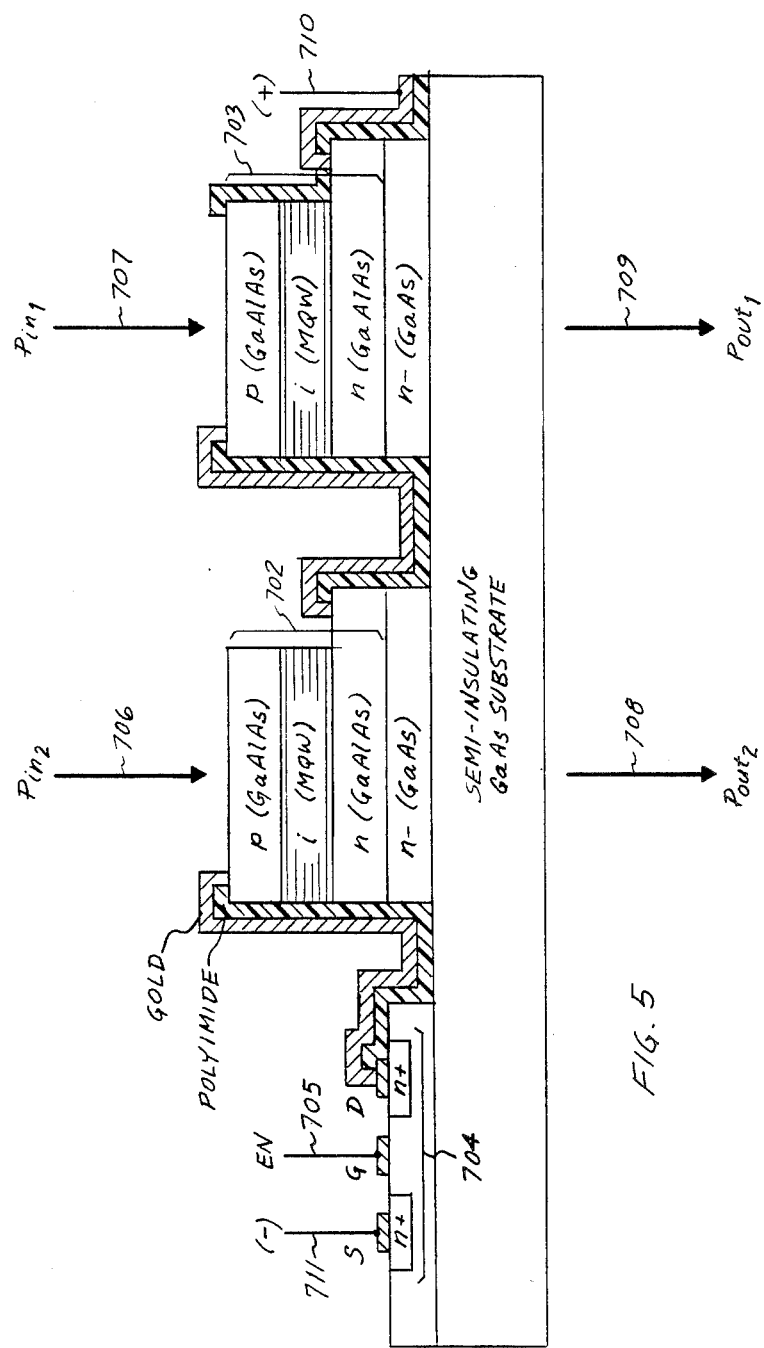
FIG. 5 depicts a monolithically integrated version of the tri-state optical device of FIG. 2.

Depicted in FIG. 5 is a monolithically integrated version of the device depicted in FIG. 2 which integrates a GaAs metal-semiconductor field effect transistor, MESFET 704, with two p-i-n photodiodes 702 and 703 with quantum wells in the intrinsic regions. Input light beams 706 and 707 are incident on the top of the device, and respective output beams 708 and 709 exit from the bottom of the device. The substrate and N-GaAs layer must be removed under a portion of the bottom of p-i-n photodiodes 702 and 703 to remove the attenuation of the exit beams that these layers would contribute. MESFET 704 is made using a standard well-known process. The power supply connections are illustrated by conductors 710 and 711, and the enable control lead is illustrated by 705.

In addition, the FET may be a selectively doped heterostructure field effect transistor (SDHT) or a high electron mobility transistor (HEMT), or the entire device may be constructed using different materials such as Indium Phosphide and Gallium Indium Arsenide Phosphide.

It is to be understood that the above-described tri-state optical device is merely an illustrative embodiment of the principles of this invention and that numerous other tri-state optical devices may be deviced by those skilled in the art without departing from the scope of this invention. In particular, one skilled in the art may develop a number of other tri-state optical memory devices using several multiple quantum-well devices and several electronic devices, many of which are not mentioned here.

What is claimed is:

1. An optical device comprising:
   first and second means including respective first and second quantum-well regions and responsive to respective first and second light beams, said first and second light beams having respective first and second optical powers, and third means responsive to an electrical current, for electrically controlling an optical absorption of each of said first and second quantum-well regions, the optical absorption of said first quantum-well region assuming one of first and second predetermined levels and the optical absorption of the second quantum-well region assuming the other of said first and second predetermined levels when at least one of a first ratio of said electrical current to said first optical power and a second ratio of said electrical current to said second optical power exceeds a first predetermined amount, the optical absorption of both of said first and second quantum-well regions assuming the greater of said first and second predetermined levels when both of said first and second ratios are less than a second predetermined amount.

2. The device of claim 1 wherein said device assumes a first complementary state with the optical absorption of said first and second quantum-well regions assuming said first and second predetermined levels, respectively, when both of said first and second ratios are greater than said first predetermined amount and a ratio of said first to said second optical power is greater than a third predetermined amount and wherein said device assumes a second complementary state with the optical absorption of said first and second quantum-well regions assuming said second and first predetermined levels, respectively, when both of said first and second ratios are greater than said first predetermined amount and said ratio of said first to said second optical power is less than a fourth predetermined amount.

3. The device of claim 1 wherein said third means comprises a p-n-p bipolar transistor.

4. The device of claim 1 wherein said third means comprises an n-p-n bipolar transistor.

5. The device of claim 4 wherein said first and second means comprise first and second p-i-n photodiodes having respective first and second intrinsic regions and said first and second quantum-well regions included in said first and second intrinsic regions, respectively.

6. The device of claim 5 wherein said n-p-n bipolar transistor comprises a heterojunction bipolar transistor having base, emitter, and collector regions and having GaAs in said base region, AlGaAs in said emitter region, and GaAs or AlGaAs in said collector region.

7. An optical device comprising:
   first and second means including respective first and second quantumwell regions and responsive to first and second light beams, respectively, and third means responsive to an electrical voltage, for electrically controlling an optical absorption of each of said first and second quantum-well regions, the optical absorption of said first quantum-well region assuming one of first and second predetermined levels, the optical absorption of the second quantum-well region assuming the other of said first and second predetermined levels when said electrical voltage exceeds a first predetermined amount and the optical absorption of both of said first and second quantum-well regions assuming the greater of said first and second predetermined levels when said electrical voltage is less than a second predetermined amount.

8. The device in claim 7 wherein said third means comprises a field effect transistor (FET).

9. The device in claim 8 wherein said the first and second means comprise first and second p-i-n photodiodes having respective first and second intrinsic regions and said first and second quantum-well regions included in said first and second intrinsic regions.

10. An optical device comprising first and second means including respective first and second quantum-well regions and responsive to respective first and second light beams each having intensity, and third means responsive to a third light beam having intensity for electrically controlling an optical absorption of each of said first and second quantum-well regions; the optical absorption of said first quantum-well region assuming one of first and second predetermined levels and the optical absorption of the other of said first and second quantum-well regions assuming the other of said first and second predetermined levels when at least one of a first ratio of the intensity of the third light beam to said first light beam and a second ratio of the intensity of said third light beam to said second light beam exceeds a first predetermined amount, the optical absorption of both of said first and second quantum-well regions assuming the largest of said first and second predetermined levels when both of said first and second ratios are less than a second predetermined amount.

11. The device of claim 10 where first, second, and third means comprise p-i-n photodiodes each having an intrinsic region and said first and second means have said first and second quantum-well regions in the intrinsic region, respectively.

12. The device in claim 11 wherein said third means comprises a p-i-n photodiode having an intrinsic region and a quantum-well region in said intrinsic region.

13. The device of claim 10 wherein said device assumes a first complementary state with the optical absorption of said first and second quantum-well regions assuming said first and second predetermined levels, respectively, when both of said first and second ratios are greater than said first predetermined amount and a ratio of the intensity of said first to said second light beam is greater than a third predetermined amount and wherein said device assumes a second complementary state with the optical absorption of said first and second quantum-well regions assuming said second and first predetermined levels, respectively, when both of said first and second ratios are greater than said first predetermined amount and said ratio of the intensity of said first to said second light beam is less than a fourth predetermined amount.

14. An optical device comprising:
   switch means having first and second states for controlling a photocurrent, and
   a bistable optical device responsive to said photocurrent and to first and second control light beams for emitting first and second output light beams having complementary power levels when a ratio of said first to said second control light beam is above a predetermined threshold and said switch means is in said first state and also for emitting said first and second output light beams both having a predetermined power level when said switch means is in said second state.

15. The device of claim 14 wherein said switch means comprises an electrically controllable switch.

16. The device of claim 15 wherein said switch means comprises a photodiode.

* * * * *